March 3, 1953 A. M. CLOGSTON 2,630,488
CAVITY RESONATOR TUNING DEVICE
Filed Nov. 27, 1944
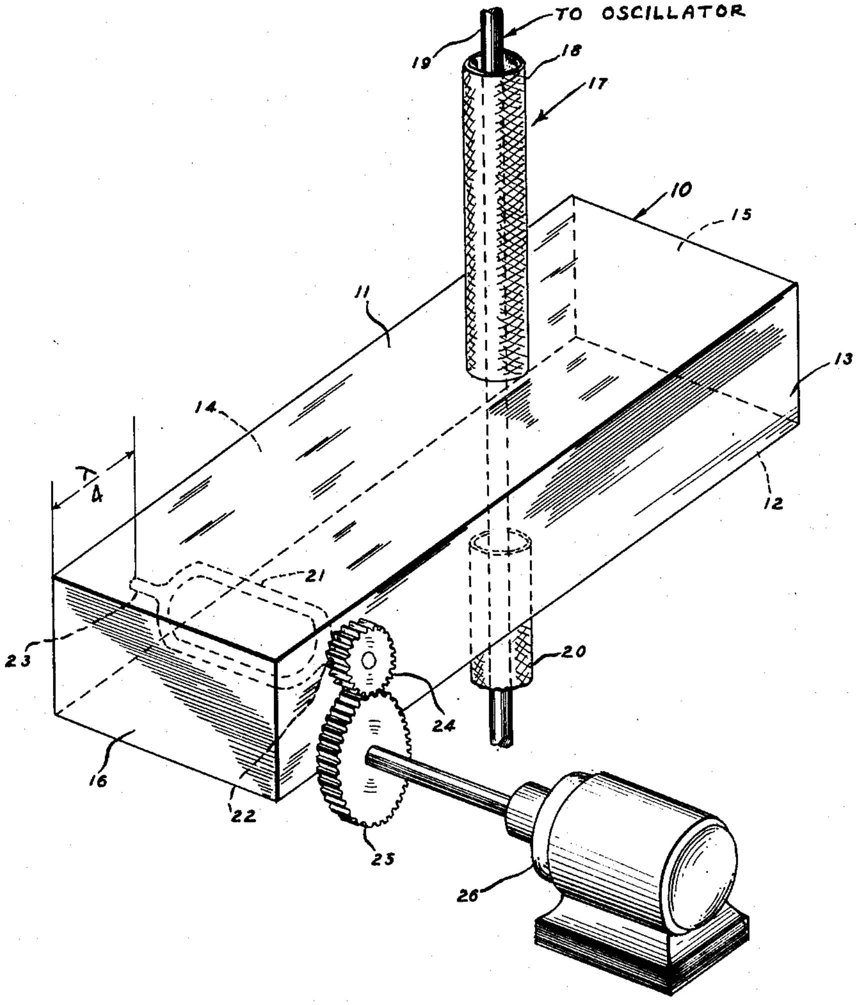
INVENTOR.
ALBERT M. CLOGSTON
BY William D. Hall
Attorney Patented Mar. 3, 1953 2,630,488

UNITED STATES PATENT OFFICE 2,630,488

CAVITY RESONATOR TUNING DEVICE

Albert M. Clogston, Cambridge, Mass., assignor, by mesne assignments, to the United States of America as represented by the Secretary of War Application November 27, 1944, Serial No. 565,363

1 Claim. (Cl. 178—44)

The present invention relates to a device for effective and rapid tuning of a radio frequency oscillator circuit and is more particularly directed to a tuning device of the kind wherein one or more transmission lines are connected to an oscillator tube such as a magnetron, and one of the lines is provided with a variable impedance which serves to vary the frequency of oscillations at the output of the oscillator tube.

In radio echo systems it has been found desirable to avoid or minimize the susceptiblity of the system to interference, particularly that type of hostile interference known as "jamming." This may be accomplished according to the present invention by varying the oscillator frequency. One means of varying the frequency is to provide a movable plunger termination to a transmission line. Such plunger tuning is at best rudimentary, and it has been found desirable to provide other methods of tuning.

The present invention contemplates use of a resonant cavity and a rotatable resonant ring to accomplish the tuning function. The advantages of resonant ring tuning over plunger tuning are: (1) rapid tuning; (2) greater convenience; (3) tuning parts which may be secured in a vacuum thus reducing troubles due to sparking; and (4) ease of remote tuning by such means as Selsyn drives.

It is therefore an object of the present invention to provide means for varying the tuning of an oscillator with great rapidity. The means by which this is accomplished utilizes a wave guide dimensioned to constitute a resonant cavity. The cavity, connected in the transmission line output circuit of the oscillator, is provided with a metal ring disposed in a predetermined position within the cavity. The ring is rotatable to present variable load impedance which accomplishes the variable tuning.

It is a further object of the invention to provide variable tuning means which may be operable in a vacuum. This may be accomplished by sealing the resonant ring inside the wave guide and evacuating the guide and associated transmission line, the rotation of the ring being accomplished by electrical means.

It is another object of the invention to provide means for tuning an oscillator such as a magnetron, by mechanical means. It is a still further object of the invention to provide tuning means which will provide an effective variable impedance termination of a wave guide and thereby be effective in varying the frequency of oscillation of an oscillator tube.

Another object of the invention is to provide tuning means which is simple and economical to construct and which is adapted to operate automatically.

Other objects and advantages of the present invention will be apparent from the following description taken in the light of the accompanying drawing, which is an isometric view of a device constructed according to the present invention.

In the drawing, 10 indicates a rectangular, hollow wave guide suitable for entertaining the $TE_{0,1}$ transmission mode. Wave guide 10 comprises wide, parallel opposing walls 11 and 12, and narrow, parallel opposing walls 13 and 14, perpendicular to walls 11 and 12. Wave guide 10 is closed at both ends by end walls 15 and 16. The walls of wave guide 10 are constructed of high conducting metal, or the inner surfaces of the walls may be coated with a material of high electrical conductivity. As shown, the wave guide 10 is of such dimensions that it will act as a resonant cavity when properly excited.

A coaxial transmission line 17 is connected in any suitable manner to a transmitting or oscillator tube, such as a magnetron, of a radio frequency transmitting apparatus (not shown). The outer conductor 18 of the cable 17 is centrally connected, as shown, to the wide wall 11 of guide 10 at a point substantially a quarter wave length distance from end wall 15. Inner conductor 19 extends into the wave guide perpendicular to the wall 11 for a distance suitable for proper excitation of the guide, or it may pass through the guide and continue on in associated coaxial cable 20 which may connect to an antenna or other apparatus.

Disposed near the opposite end of wave guide 10 from the associated coaxial cable is a reflecting member or resonant ring 21. Member 21 is provided at opposite ends with bearing pins 22 and 23 journaled in suitable bearings carried by walls 13 and 14 respectively; or it may otherwise be suitably pivoted on an axis parallel to the wide walls 11 and 12 and perpendicular to the narrow walls 13 and 14. Any suitable means may be provided for rapidly rotating member 21, for example, a gear train indicated generally by gear 24 carried by bearing pin 22 and gear 25 meshing therewith, the latter being actuated by a motor 26.

Member 21 may consist of a resonant ring or loop or even a solid sheet of metal such as copper and may be generally round or rectangular in shape. (Or it may have some other shape; or indeed a resonant structure having a plane surface of some other shape which is not a ring at all may be used.) In the rectangular wave guide shown it is preferable to provide a ring of generally rectangular shape extending substantially across the width of the wave guide.

While the term "resonant ring" is used in this description, it is to be understood that member 21 may be designed to resonate at a frequency other than the mid-frequency of the tuning range. In fact particularly satisfactory results have been achieved with the present device through use of a member 21 adapted to resonate at a frequency somewhat higher than the mid-frequency of the tuning range.

The resonant member 21 is disposed within wave giude 10 so that its distance from end wall 16 is substantially a quarter wave length of a representative operating frequency. When the member 21 is rotated so that its plane is perpendicular to the end wall 16, it presents little or no impedance to the energy in the guide, thereby permitting the wave guide 10 to resonate at its normal frequency. It will be apparent that as the member 21 is rotated away from this position, the resonant frequency of the guide will change, thus causing the output frequency of the oscillator to vary accordingly. The speed at which member 21 is rotated may be chosen according to a predetermined rate of change of the output frequency.

While the foregoing apparatus shows the transmission line from the oscillator to the resonant wave guide in the form of a coaxial cable, it is to be understood that other forms of transmission lines may be used. For example, an equivalent wave guide type transmission line may be used.

Having thus described the invention, what is claimed as new and desired to be secured by Letters Patent is:

In combination with a high frequency oscillator, a device for tuning said oscillator through a given range of frequencies, comprising a completely enclosed cavity resonator, a ring resonant at a frequency within said range and disposed within said resonator at a distance of approximately a quarter of a wave length at a given operating frequency from one end wall thereof, said resonant ring being rotatably mounted on opposite points of the walls of said cavity resonator, means for rotating said resonant ring so as to vary the frequency of said resonator between the limits of said range of frequencies, and transmission line means disposed within said cavity resonator at a distance of approximately a quarter of a wave length at said given operating frequency from the other end well thereof for coupling said cavity resonator to said oscillator.

ALBERT M. CLOGSTON.

REFERENCES CITED

The following references are of record in the file of this patent:

UNITED STATES PATENTS

| Number | Name | Date |
|---|---|---|
| 2,088,461 | Briggs | July 27, 1937 |
| 2,177,272 | Zottu | Oct. 24, 1939 |
| 2,280,824 | Hansen et al. | Apr. 28, 1942 |
| 2,286,396 | Trevor | June 16, 1942 |
| 2,296,678 | Linder | Sept. 22, 1942 |
| 2,306,282 | Samuel | Dec. 22, 1942 |
| 2,311,658 | Hansen | Feb. 23, 1943 |
| 2,312,919 | Linton | Mar. 2, 1943 |
| 2,408,425 | Jenks | Oct. 1, 1946 |
| 2,410,656 | Herold | Nov. 5, 1946 |
| 2,427,100 | Kihn | Sept. 9, 1947 |
| 2,434,508 | Okress | Jan. 13, 1948 |
| 2,480,208 | Alvarez | Aug. 30, 1949 |